United States Patent [19]
Kimura et al.

[11] Patent Number: 5,920,115
[45] Date of Patent: *Jul. 6, 1999

[54] SEMICONDUCTOR DEVICE AND DISPLAY UNIT USING THE SEMICONDUCTOR DEVICE AND NOTEBOOK-SIZE PERSONAL COMPUTER

[75] Inventors: Makoto Kimura, Kodaira; Shinji Tojo, Higashimurayama; Takahiro Fujioka, Mobara; Akihiko Narisawa, Kodaira; Yoshiyuki Tanigawa, Higashimurayama, all of Japan; Shinya Kanamitsu, Brisbane, Calif.; Koji Akimoto, Tachikawa; Hiroyuki Mouri, Kunitachi, both of Japan

[73] Assignees: Hitachi, Ltd., Tokyo; Hitachi Device Engineering Corp., Chiba, both of Japan

[ * ] Notice: This patent is subject to a terminal disclaimer.

[21] Appl. No.: 08/962,396

[22] Filed: Oct. 31, 1997

Related U.S. Application Data

[63] Continuation of application No. 08/662,968, Jun. 13, 1996, Pat. No. 5,767,571.

[30] Foreign Application Priority Data

Jun. 16, 1995 [JP] Japan .................................. 7-150200

[51] Int. Cl.$^6$ .................. H01L 23/495; H01L 23/48; H01L 23/28; G09G 3/36
[52] U.S. Cl. .................. 257/668; 257/666; 257/676; 257/673
[58] Field of Search .................. 257/668, 669, 257/666, 677, 674, 675

[56] References Cited

U.S. PATENT DOCUMENTS

| | | | |
|---|---|---|---|
| 5,227,232 | 7/1993 | Lim | 257/668 |
| 5,252,853 | 10/1993 | Michii | 257/666 |
| 5,357,139 | 10/1994 | Yaguchi et al. | 257/666 |
| 5,442,231 | 8/1995 | Miyamoto et al. | 257/666 |
| 5,448,387 | 9/1995 | Kurokawa et al. | 257/668 |
| 5,506,444 | 4/1996 | Chikawa et al. | 257/666 |
| 5,585,600 | 12/1996 | Froebel et al. | 257/666 |
| 5,585,665 | 12/1996 | Anjoh et al. | 257/666 |
| 5,585,666 | 12/1996 | Imamura | 257/668 |
| 5,659,198 | 8/1997 | Okutomo et al. | 257/787 |
| 5,726,491 | 3/1998 | Tajima et al. | 257/787 |
| 5,767,571 | 6/1998 | Kimura et al. | 257/668 |

FOREIGN PATENT DOCUMENTS

| | | |
|---|---|---|
| 2-211643 | 8/1990 | Japan . |
| 3-97241 | 4/1991 | Japan . |
| 5-166812 | 7/1993 | Japan . |

OTHER PUBLICATIONS

VLSI Packaging Art, vol. 1, May 31, 1993, issued by Nikkei Business Publications, Inc., pp. 139–141,267–274, with English translations.

*Primary Examiner*—Alexander Oscar Williams
*Attorney, Agent, or Firm*—Fay, Sharpe, Beall, Fagan, Minnich & McKee

[57] ABSTRACT

To provide a semiconductor device in which a thin resin film is provided on the whole margin of the principal plane of a semiconductor chip a lead is provided on the thin resin film, the lead is electrically connected with input and output electrode pads of the semiconductor chip, and the electrical joint is covered and sealed with a seal resin.

20 Claims, 8 Drawing Sheets

0.5~0.7mm

SEMICONDUCTOR DEVICE AND DISPLAY UNIT USING THE SEMICONDUCTOR DEVICE AND NOTEBOOK-SIZE PERSONAL COMPUTER

This is a continuation application of U.S. Ser. No. 08/662,968, filed Jun. 13, 1996, now U.S. Pat. No. 5,767, 571.

BACKGROUND OF THE INVENTION

The present invention relates to a semiconductor device for liquid crystal displays comprising a tape carrier package (TCP) and a display unit mounting the Ad semiconductor device, and to a notebook-size personal computer having the display unit.

A conventional semiconductor device (LSI) for liquid crystal displays uses a TCP in order to decrease the thickness of the liquid crystal display (LCD) unit. The semiconductor device for LCDs is arranged around a display section of the liquid crystal display unit.

The above conventional semiconductor device for LCDs has a slender semiconductor chip and a slender TCP. Thus, the semiconductor device is made slender and the width of the margin of the display section (casing of the frame of the display unit) of the liquid crystal display unit is decreased so as to obtain a larger display area for the frame.

Moreover, to decrease the width of the margin of the display section of the liquid crystal display unit, there is a method of forming a folding portion on a TCP tape and arranging it on the back or side of a semiconductor device.

In the case of an example of the above conventional semiconductor device for LCDs, as shown in FIG. 12, input electrode pads or bumps (hereafter referred to as electrode pads) 2a and output electrode pads 2b are formed at the margin of a semiconductor chip 1, the input and output electrode pads 2a and 2b are electrically connected with inner leads (portions covered with a sealing resin) 4 of input lead 4a and output lead 4b, and the joints are sealed with a sealing resin 5.

Moreover, a device hole 6 larger than the semiconductor chip 1 for electrically connecting the semiconductor chip 1 with the inner leads 4 is formed at the central portion of a tape 3, and an input-side hole 7 is formed at an outer lead (portion exposed from the sealing resin) of the input lead 4a.

A semiconductor device using a carrier tape is disclosed in, for example, the official gazette of Japanese Patent Laid-Open No. 166812/1993 and a mounting for a semiconductor device using a TCP and for a semiconductor device for LCDs is disclosed on, for example, pp. 139–141 and pp. 267–274 in "JISSENKOZA" (transliterated) VLSI Packaging Art (Volume One)" issued by Nikkei Business Publications, Inc. on May 31, 1993.

SUMMARY OF THE INVENTION

The present inventors found the following problems as the result of studying the conventional semiconductor device for LCDs shown in FIG. 12.

(1) In the case of the above conventional semiconductor device, the input electrode pad 2a and the output electrode pad 2b are arranged at the margin on the principal plane of the semiconductor chip 1. The input electrode pad 2a and the output electrode pad 2b are connected with the inner leads 4 on the tape 3 in the device hole 6 and the semiconductor chip 4 and one of the leads 4 are sealed with the sealing resin 5. A resin sealing range on the tape 3 is necessary to a certain extent. The resin sealing range depends on the spread of resin flow and the size of the semiconductor chip 1. Therefore, it is impossible to decrease the width of the casing of the frame around the display section of the liquid crystal display unit.

(2) In the case of the conventional semiconductor device for LCDs, as shown in FIG. 12(b) {sectional view taken along the line XII—XII in FIG. 12(a)}, the sealing resin 5 flows to and spreads on the back of the tape 3, thereby causing unreliable connection of wiring on glass of a liquid crystal display panel and a wiring pad of a printed circuit board with an input/output pad of a liquid crystal display semiconductor device.

(3) In the case of the conventional semiconductor device for LCDS, as shown in FIG. 12(b), the reliability for a short circuit formed between the inner leads 4 and the semiconductor chip is deteriorated because the tape 3 is not secured onto the principal plane of the semiconductor chip as shown in FIG. 12(b).

(4) In the case of the conventional semiconductor device for LCDs, as shown in FIG. 12(a), it is necessary to work the electrode pads 2 and the input lead 4a and output lead 4b formed on the TCP tape 3 and folded portions 4a1 and 4b of the inner leads 4.

(5) As shown in FIG. 12(a), the conventional semiconductor device for LCDs, cannot be downsized because the inner leads 4 of the output lead 4b on the TCP tape 3 provided at the margin of the short side of the semiconductor chip 1 include the folded portions 4a1 and 4b1.

(6) The method of forming a folded portion on the tape 3 and arranging a semiconductor device on the back or side of a liquid crystal display unit has the problems that it is necessary to form a folded portion on the tape 3, the liquid crystal display unit becomes thick, and it is difficult to fabricate the liquid crystal display unit. Moreover, the cost increases because a folded portion must be formed on the tape 3.

It is an object of the present invention to provide a semiconductor device which can be downsized without deteriorating its functions.

It is another object of the present invention to provide a semiconductor device which can be downsized without deteriorating its reliability.

It is still another object of the present invention to provide a semiconductor device for LCDs, which allows the ratio of the display area to the frame area to decrease.

The above and other objects and novel features of the present invention will become apparent from the description of the present specification and accompanying drawings.

The outline of a typical one of the inventions disclosed in the present application is briefly described below.

A thin resin film (tape) of a TCP tape is provided on the whole margin of the principal plane of a semiconductor chip, a lead is provided on the thin resin film, the lead is electrically connected with an electrode pad of the semiconductor chip, and the electrical joint is covered with a sealing resin.

In the above semiconductor device, input leads and output leads are separately arranged in a line.

In the above semiconductor device, the input leads and the output leads are separately arranged in parallel in a line.

In the above semiconductor device, the electrode pad of the semiconductor chip is arranged at the central portion of the semiconductor chip in the longitudinal direction of the chip.

In the above semiconductor device, the arrangement pitch between electrode pads of the semiconductor chip is almost equal to that of the leads.

In the above semiconductor device, the leads are arranged at equal intervals.

In the above semiconductor device, the lead is arranged only in the longitudinal direction of the semiconductor chip but it does not have any folded portion.

In the above semiconductor device, a test device and an alignment mark are provided between the input electrode pad and one end of the semiconductor chip and an output buffer is provided between the output electrode pad and the other end of the semiconductor chip.

In the above semiconductor device, the distance between the input electrode pad and the one end of the semiconductor chip is almost equal to that between the output electrode pad and the other end of the semiconductor chip.

In the above semiconductor device, the semiconductor chip is cut in an area nearby the output side of the next chip.

A liquid crystal display unit comprises the above semiconductor device electrically connected between a printed circuit board and a liquid crystal panel.

A semiconductor device comprises a semiconductor chip having a principal plane and a plurality of electrode pads formed on the principal plane, a thin resin film having a surface and a back and locally having an opening reaching the back from the surface, a plurality of leads which are formed on the surface of the thin resin film, the leads having one end extending into the opening, and a sealing resin for covering a part of the principal plane of the semiconductor chip, wherein the thin resin film is located between the semiconductor chip and the lead and the opening of the thin resin film is formed at a position where the electrode pads of the semiconductor chip on the principal plane of the semiconductor chip are exposed, the leads are electrically connected at one end to the electrode pads, the opening is smaller than the principal plane of the semiconductor chip and the thin resin film is overlapped with the semiconductor chip on the whole circumference of the semiconductor chip.

Moreover, a semiconductor device comprises:

a semiconductor chip having a rectangular principal plane and a plurality of electrode pads formed on the principal plane;

a thin resin film having a surface and a back and locally having a rectangular opening reaching the back from the surface;

a plurality of leads formed on the surface of the thin resin film, the leads having one end extending into the opening; and a sealing resin for covering a part of the principal plane of the semiconductor chip and the portion where the leads extend into the opening; wherein the thin resin film is located between the semiconductor chip and the leads and the opening of the thin resin film is formed at a position where the electrode pads on the principal plane of the semiconductor chip are exposed, the leads are electrically connected at one end to the electrode pads, and each side of the rectangular opening is located on the principal plane of the semiconductor chip.

Furthermore, a semiconductor device comprises:

a semiconductor chip having a rectangular principal plane, a plurality of first electrode pads arranged on the principal plane in a line along a first long side, and a plurality of second electrode pads arranged in a line along a second long side;

a thin resin film having a surface and a back and locally having an opening reaching the back from the surface in which first and second sides for specifying the opening are included and the first side is close to the first long side and the second side is close to the second long side;

a plurality of first leads which are formed on the surface of the thin resin film and extend across the first side of the thin resin film, the first leads having one end extending into the opening;

a plurality of second leads which are formed on the surface of the thin resin film and extend across the second side of the thin resin film, the second leads having one end extending into the opening; and a sealing resin for covering a part of the principal plane of the semiconductor chip and a portion where the leads extend into the opening; wherein the thin resin film is located between the semiconductor chip and the leads and the opening of the thin resin film is formed at a position where the electrode pads on the principal plane of the semiconductor chip are exposed, the first leads are electrically connected at one end with the first electrode pads and the second leads *are electrically connected at one end with the second electrode pads, and the first side is located between the first long side and the first electrode pads of the semiconductor chip and the second side is located between the second long side and the second electrode pads of the semiconductor chip.

Furthermore, a display unit comprises a display panel, a printed circuit board, and a semiconductor device electrically connected to the display panel and the printed circuit board, and a frame for sealing the printed circuit board and the semiconductor device; wherein the semiconductor device includes a semiconductor chip having a rectangular principal plane, a plurality of first electrode pads arranged on the principal plane in a line along a first long side, and a plurality of second electrode pads arranged in a line along a second long side, a thin resin film having a surface and a back and locally having an opening reaching the back from the surface, in which first and second sides for specifying the opening are included and the first side is close to the first long side and the second side is close to the second long side, a plurality of first leads which are formed on the surface of the thin resin film and extend across the first side of the thin resin film, the first leads having one end extending into the opening, a plurality of second leads which are formed on the surface of the thin resin film and extend across the second side of the thin resin film, the second leads having one end extending into the opening, and a sealing resin for covering a part of the principal plane of the semiconductor chip and a portion where the leads extend into the opening;

the thin resin film is located between the semiconductor chip and the leads and the opening of the thin resin film is formed at a position where the electrode pads on the principal plane of the semiconductor chip are exposed;

the first leads are electrically connected at one end to the first electrode pads and the second leads are electrically connected at one end to the second electrode pads; and the first side is located between the first long side and the first electrode pads of the semiconductor chip and the second side is located between the second long side of the semiconductor chip and the second electrode pads.

Furthermore, a notebook-size personal computer comprises a display unit including a display panel, a printed circuit board, a semiconductor device connected to the display panel and the printed circuit board, a case for sealing the display panel, printed circuit board, and semiconductor device, and a keyboard section electrically connected to the display unit; wherein the semiconductor device includes a semiconductor chip having a rectangular principal plane, a plurality of first electrode pads arranged in a line along a first long side and a plurality of second electrode pads arranged in a line along a second long side, a thin resin film having a surface and a back and locally having an opening reaching the back from the surface, in which first and second sides for specifying the opening are included and the first side is close to the first long side and the second side is close to the second long side, a plurality of first leads which are formed on the surface of the thin resin film and extend across the first side of the thin resin film, the first leads having one end extending into the opening, a plurality of second leads which are formed on the surface of the thin resin film and extend across the second side of the thin resin film, the second leads having one end extending into the opening, and a sealing resin for covering a part of the principal plane of the semiconductor chip and a portion where the leads extend into the opening;

the thin resin film is located between the semiconductor chip and the leads and the opening of the thin resin film is formed at a position where the electrode pads on the principal plane of the semiconductor chip are exposed;

the first leads are electrically connected at one end to the first electrode pads and the second leads are electrically connected at one end to the second electrode pads; and the first side is located between the first long side and the first electrode pads of the semiconductor chip and the second side is located between the second long side and the second electrode pads of the semiconductor chip.

According to an aspect of the present invention, it is possible to securely connect a packaging board and a semiconductor device when the semiconductor device is mounted on the substrate and downsize the semiconductor device without deteriorating its functions or reliability because a sealing resin does not flow to the back of a TCP tape by securing a thin resin film of the TCP tape to the whole margin of the principal plane of a semiconductor chip.

According to another aspect of the present invention, it is possible to downsize a semiconductor device without deteriorating its reliability because a lead does not have any folded portion by separately arranging input leads and output leads in parallel in a line.

According to still another aspect of the present invention, it is possible to easily execute fabrication processes and securely prevent the sealing resin 5 from flowing to the back of the TCP tape 3 because the semiconductor chip 1 can sufficiently be overlapped with a thin resin film (tape) 3a of the TCP tape 3 by arranging the electrode pads of the semiconductor chip at the central portion of the semiconductor chip in the longitudinal direction of the chip.

According to still another aspect of the present invention, it is possible to downsize a semiconductor device without deteriorating its reliability because the shorting frequency of the leads is decreased by almost equalizing the arrangement pitch between the electrode pads of the semiconductor chip with that of the leads of the chip and arranging the leads at equal intervals only in the longitudinal direction of the semiconductor chip.

According to still another aspect of the present invention, it is possible to further easily and securely execute fabrication processes and securely prevent the sealing resin 5 from flowing to or spreading on the back of the tape 3 because the semiconductor chip 1 can sufficiently be overlapped with the thin resin film (tape) 3a of the PCT tape 3 at both input and output sides by setting a test device and an alignment mark between the input electrode pad and one end of the semiconductor chip, setting an output buffer between the output electrode pad and the other end of the semiconductor chip, and almost equalizing the distance between the one end and the input electrode pad of the semiconductor chip with the distance between the other end and the output electrode pad of the semiconductor chip.

According to still another aspect of the present invention, it is possible to downsize a semiconductor device without deteriorating its functions or reliability because the semiconductor chip is disconnected in an area nearby the output side of the next chip.

According to still another aspect of the present invention, it is possible to increase a display area while keeping the frame size of the liquid crystal display unit constant, or downsize the frame size while keeping the display area constant, by electrically connecting a semiconductor device according to any one of the above means (1) to (10) between a substrate and liquid crystal.

The present invention is described below in detail together with embodiments by referring to the accompanying drawings.

In every drawing for explaining embodiments, components having the same function are provided with the same symbol and their repetitive description is omitted.

EMBODIMENTS

Embodiment 1

Figure 1:
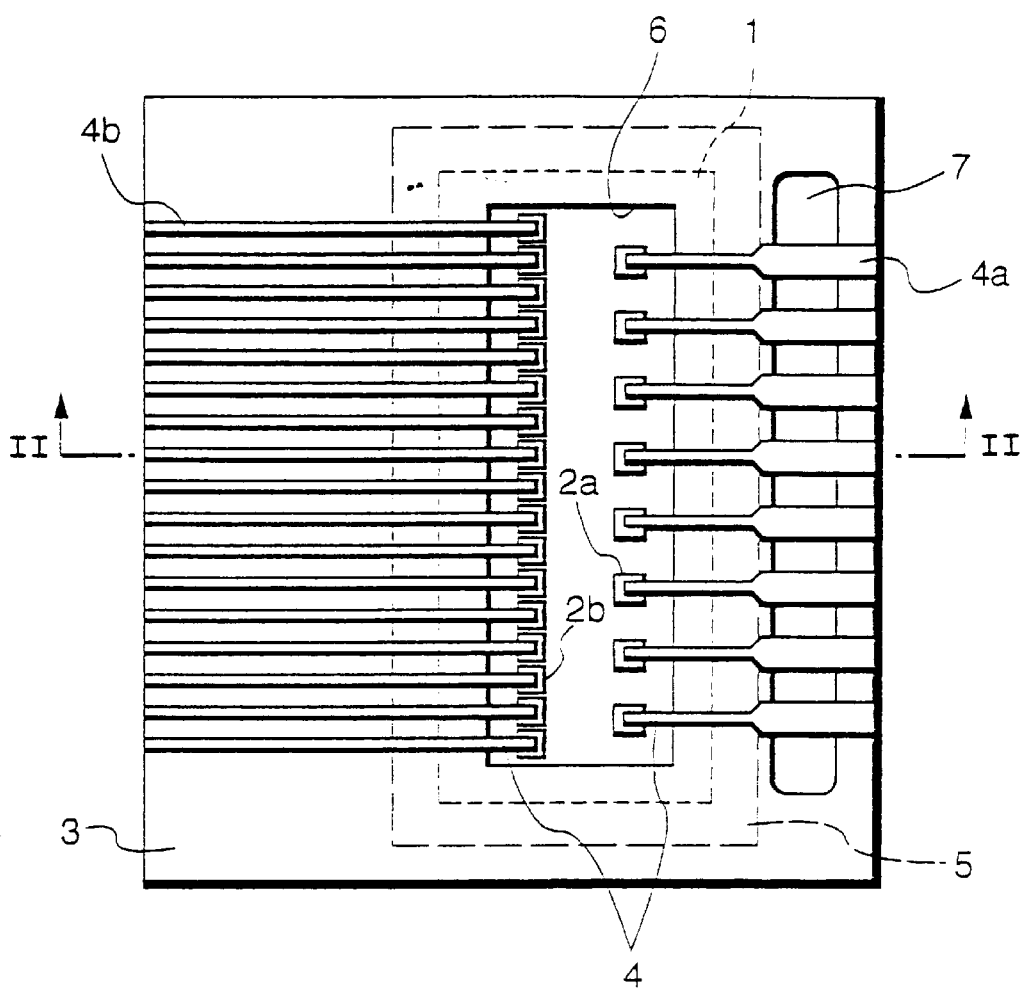
FIG. 1 is a top view showing a schematic structure of the semiconductor device of embodiment 1 of the present invention where the top sealing resin is removed from the semiconductor device.
Figure 2:
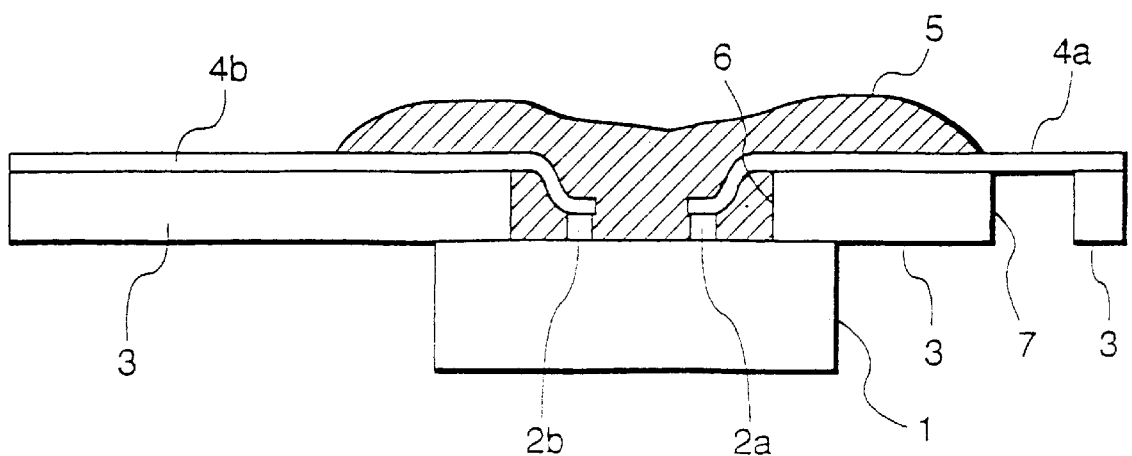
FIG. 2 is a sectional view of the semiconductor device in FIG. 1, taken along the line II—II of FIG. 1.
Figure 3:
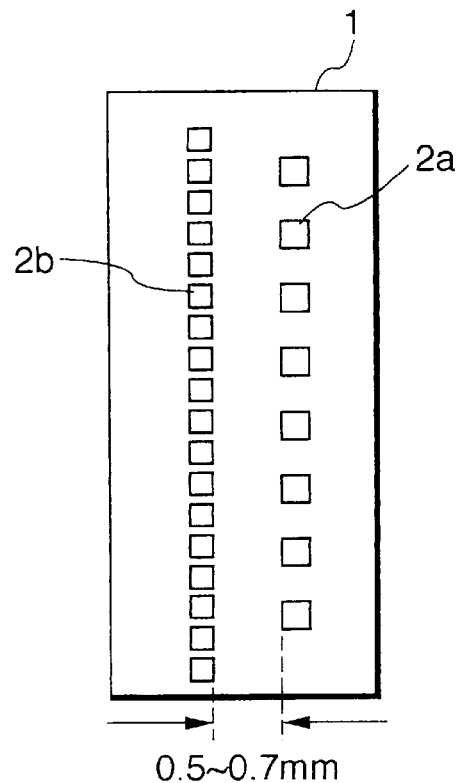
FIG. 3 is a top view of the principal plane of the semiconductor chip of embodiment 1 of the present invention.

FIG. 1 is a top view showing a schematic structure of the semiconductor device (a sealing resin only in the area is shown) of embodiment 1 of the present invention, FIG. 2 is a sectional view of the semiconductor device of embodiment 1 in FIG. 1, taken along the line II—II of FIG. 1, and FIG. 3 is a top view of the principal plane of the semiconductor chip of embodiment 1. In this case, FIG. 1 shows only the range to be mounted on a substrate and liquid crystal as understood by comparing FIG. 1 with FIG. 6.

In FIGS. 1 to 3, reference numeral 1 represents a semiconductor chip having a rectangular principal plane on which a plurality of semiconductor devices are formed. Reference numeral 2a represents an input electrode pad or input bump (hereafter referred to as an input electrode pad), 2b represents an output electrode pad or output bump (hereafter referred to as an output electrode pad), 3 represents a thin resin film (tape) made of polyimide, 4 represents parts of an input lead and output lead which are inner leads covered with a sealing resin, 4a represents an input lead, 4b represents an output lead, 5 represents a sealing resin (only the range of a sealing area is shown by a broken line in FIG. 1), 6 represents a device hole for electrically connecting the semiconductor chip 1 with the inner lead 4, and 7 represents an input-side hole to which a soldering iron is applied to mount a semiconductor device on a substrate.

In the case of the semiconductor device of embodiment 1 of the present invention, as shown in FIGS. 1 to 3, the thin resin film (tape) 3 made of polyimide is provided at the whole margin (four sides) of the principal plane of the rectangular semiconductor chip 1 so that the film 3 overlaps with the principal plane of the semiconductor chip 1, the input lead 4a and the output lead 4b are provided on the film 3, each inner lead 4 is electrically connected with the input electrode pad 2a and the output electrode pad 2b of the semiconductor chip 1, and the sealing resin 5 is provided so as to cover the electrical joint and the device hole.

The input lead 4a and the output lead 4b are provided on the thin resin film (tape) 3 made of polyimide, the device hole 6 smaller than the semiconductor chip 1 for electrically connecting the semiconductor chip 1 with the inner leads 4 is formed at the central portion of the thin resin film (tape) 3 made of polyimide, and the input-side hole 7 is formed at the outer lead of the input lead 4a.

The device hole 6 is, for example, rectangular and its long and short sides correspond to the rectangular principal plane of the semiconductor chip 1. The long and short sides of the rectangular device hole 6 are shorter than the long and short sides of the semiconductor chip. That is, an end of the tape 3 specifying the device hole 6 is located on the principal plane at the whole margin of the semiconductor chip 1.

The device hole 6 may not necessarily be rectangular if its size is large enough to expose the input and output electrode pads 2a and 2b.

Moreover, the parallel long sides of the device hole 6 are located nearby the long sides of the principal plane of the semiconductor chip 1. More particularly, one long side of the device hole is located between the line of the input electrode pad 2a and one long side of the semiconductor chip and the other long side of the device hole is located between the line of the output electrode pad 2b and the other long side of the semiconductor chip.

Because the size of the device hole 6 is smaller than that of the semiconductor chip 1, the sealing resin 5 does not flow to the back (the plane opposite to the sides of the input lead 4a and the output lead 4b) of the thin resin film (tape) 3. Even if the resin 5 flows to the back of the thin resin film 3, the quantity of the resin 5 is small.

As shown in FIG. 1, the input lead 4a and the output lead 4b extend in the direction crossing the long side of the rectangular semiconductor chip 1, that is, in the direction perpendicular to the long side. The input lead 4a and the output lead 4b are parallel with each other and arranged only on the long sides of the semiconductor chip 1 respectively, and linearly formed with no folded portion in the range shown in FIG. 1.

As shown in FIGS. 1 and 3, the input electrode pad 2a and the output electrode pad 2b of the semiconductor chip 1 are arranged in a line at the central portion of the semiconductor chip 1 only in the longitudinal direction of the chip 1. The input and output electrode pads 2a and 2b and the input lead 4a and the output lead 4b of the semiconductor chip 1 are arranged so that the arrangement pitch between the leads 2a and 2b is almost equal to that of the leads 4a and 4b. Thereby, the input lead 4a and the output lead 4b are linearly formed.

The input lead 4a and the output lead 4b are made of a copper (Cu) foil pattern.

Figure 4:
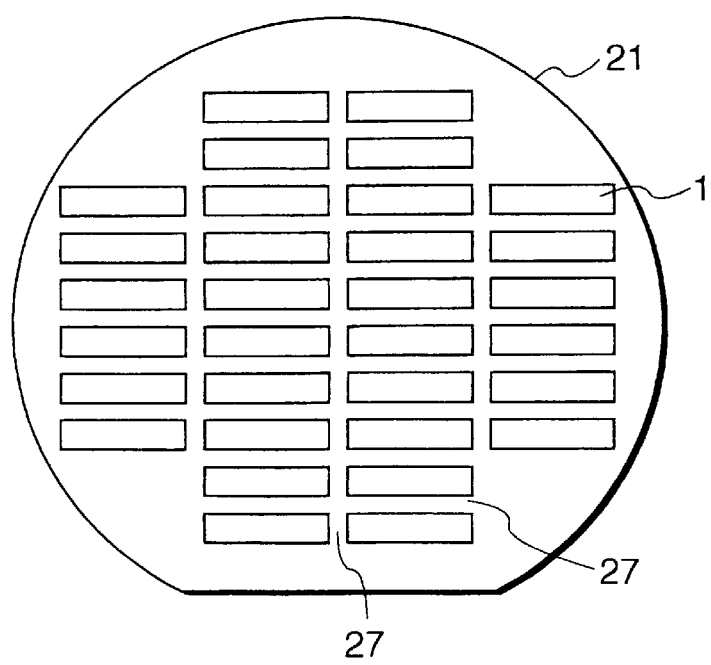
FIG. 4 is a top view of the principal plane showing the structure of the whole wafer of embodiment 1 of the present invention.
Figure 5:
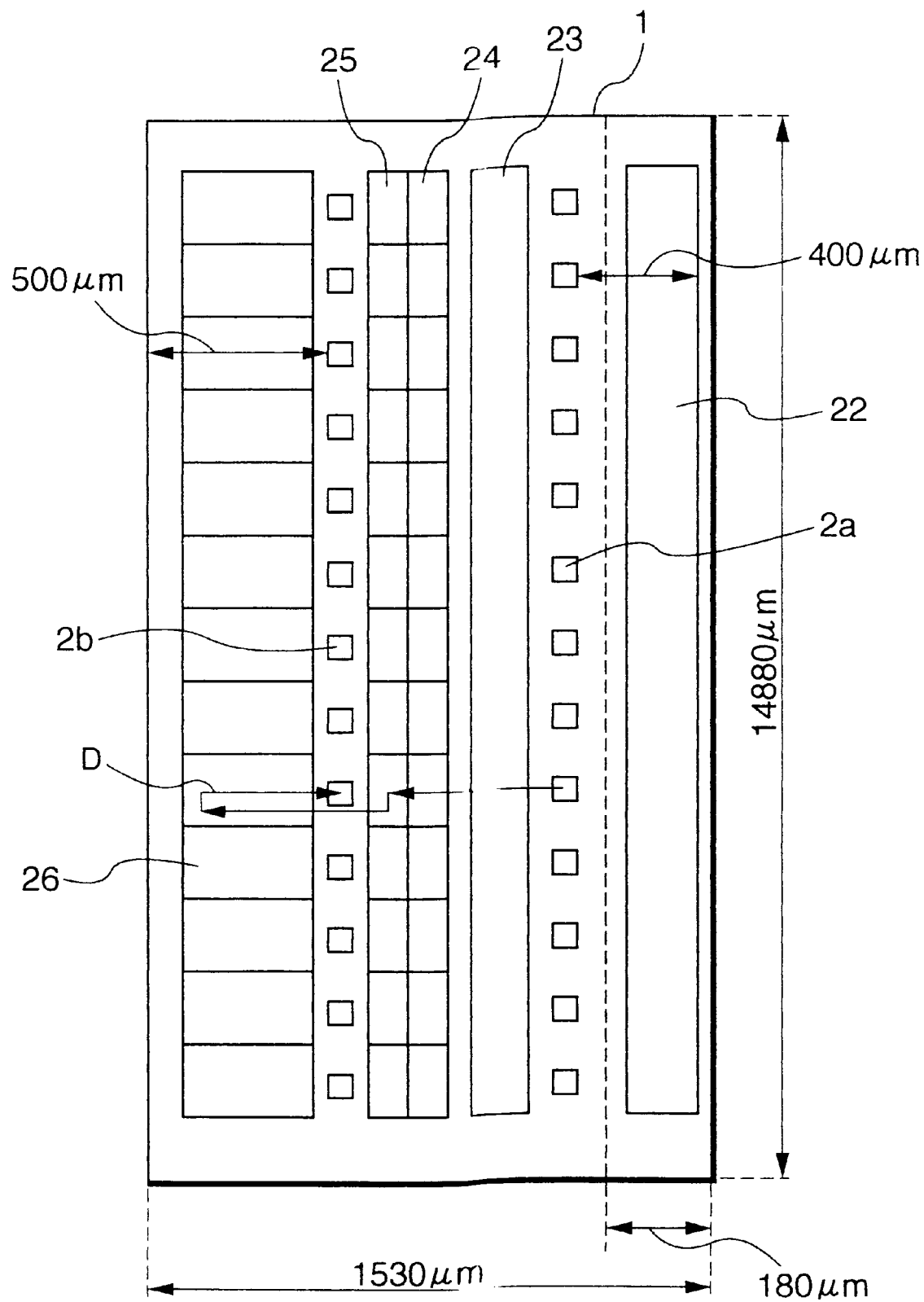
FIG. 5 is a top view showing a schematic structure of the semiconductor chip of embodiment 1 of the present invention.

FIG. 4 is a top view of the principal plane showing the structure of the whole semiconductor wafer of embodiment 1 of the present invention and FIG. 5 is a top view showing a schematic structure of one semiconductor chip on the semiconductor wafer in FIG. 4. In FIGS. 4 and 5, numeral 21 represents a semiconductor wafer, 22 represents a test device (TEG) and an alignment mark, 23 represents a logic circuit, 24 represents a latch, 25 represents a decoder, 26 represents an output buffer, and 27 represents a dicing area. The dicing area 27 is an area for separating a plurality of semiconductor chips 1 from the semiconductor wafer 21 and it is formed around each semiconductor chip 1.

As shown in FIG. 5, the semiconductor chip 1 has a rectangular principal plane on which a plurality of semiconductor devices (e.g. MISFETs) are formed on the principal plane. The above described circuit is constituted by connecting the semiconductor devices by wires.

A test device and an alignment mark arrangement area 22 are present along one long side of the principal plane of the semiconductor chip 1. A plurality of input electrode pads 2a are arranged in a line along the long side inside of the principal plane. A logic circuit forming area 23 is rectangularly arranged inside of the input electrode pads 2a along the long side.

A plurality of output buffer circuits 26 are arranged in a line along the other long side of the principal plane of the semiconductor chip 1 nearby the other long side parallel with one long side of the chip 1. A plurality of output electrode pads 2b are arranged in a line inside of the output buffer circuits 26 along the long side. The number of output buffer circuits 26 is equal to the number of output electrode pads 2b and the circuits 26 and the pads 2b are arranged one to one.

The latch 24 and the decoder 25 are arranged between the logic circuit 23 and each output electrode pad 2b.

In the case of the semiconductor chip 1 of embodiment 1 of the present invention, data input to the input electrode pad 2a is stored in the latch 24 through the logic circuit 23. Thereafter, the data is sent to the output buffer 26 through the decoder 25 and output from the output electrode pad 2b as output data. The flow of the data is shown by the arrow D in FIG. 5.

Data is transferred to the latch 24 at a high speed of 10 to 20 MHz. Then, output data is transferred from the latch 24 to the decoder 25. Therefore, it is necessary to arrange the latch 24 and the decoder 25 adjacently to each other. When the circuit 24 and the decoder 25 are arranged separately from each other, wiring areas equal to the number of outputs (160 to 240 lines) are necessary and the size of the semiconductor chip 1 increases. For the above-described high-speed data transfer and wiring area reduction, it is efficient to arrange the input electrode pad 2a, logic circuit 23, and latch 24 from the margin of the semiconductor chip 1 in order in the above described sequence in accordance with the flow of data. However, to downsize a TCP, the present invention requires an area for overlapping the thin resin film 3 with the semiconductor chip 1 in the case of the present invention. Therefore, the test-device (TEG) and alignment-mark area 22 is effectively used as a portion to be overlapped with the thin resin film (tape) 3. The test-device (TEG) and alignment-mark area 22 has a width of 180 $\mu$m, which is cut conventionally by a blade of 100 to 150 $\mu$m. In the case of this embodiment, a portion of the area close to the output side is cut by a 35-$\mu$m blade and the test-device and alignment-mark area 22, that is, an area in which a device not directly related to operations of a semiconductor chip is formed is left at the input side.

The output data is sent from the decoder 25 to the output buffer 26 and the output electrode pad 2b. In this case, the signal temporarily flows in the opposite direction. However, the semiconductor device 1 does not greatly suffer from signal delay as a whole because the signal speed is as low as 60–120 Hz. Moreover, because output data is transferred through the side of the output electrode pad 2b, it is not necessary to increase the size of the semiconductor chip 1. Thus, by arranging the output buffer 26 outside the output electrode pad 2b, the output electrode pads 2b are arranged at the central portion of the semiconductor chip 1 only in the longitudinal direction of the chip 1 and an area for putting the thin resin film 3 on the principal plane of the semiconductor chip 1 is formed.

Figure 10:
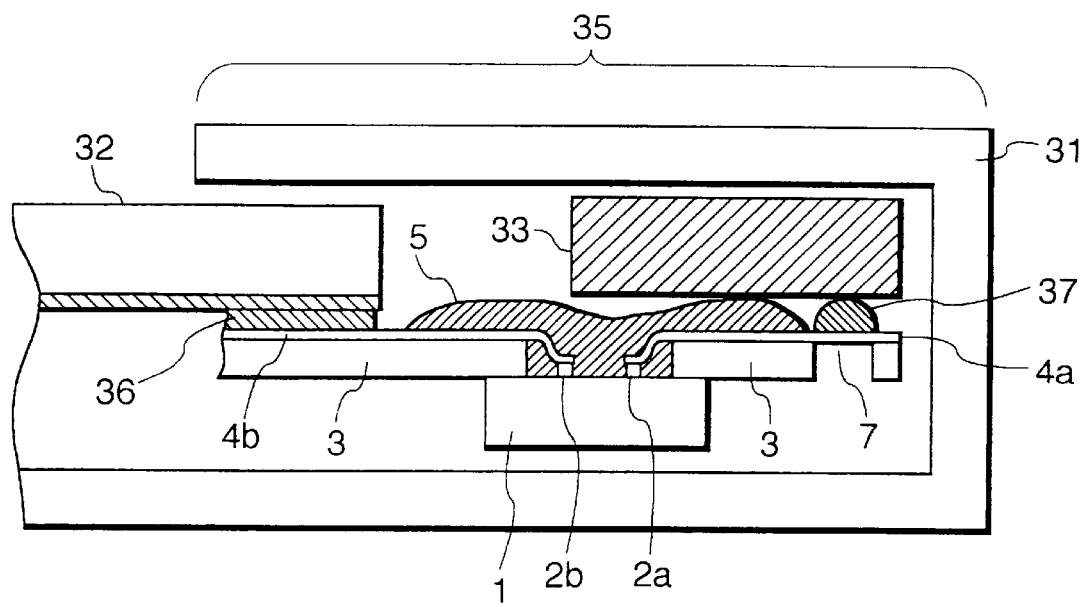
FIG. 10 is a sectional view, taken along the line X—X of FIG. 9, showing a modification of an electrode pad setting position of the semiconductor m device of embodiment 1 of the present invention.
Figure 11:
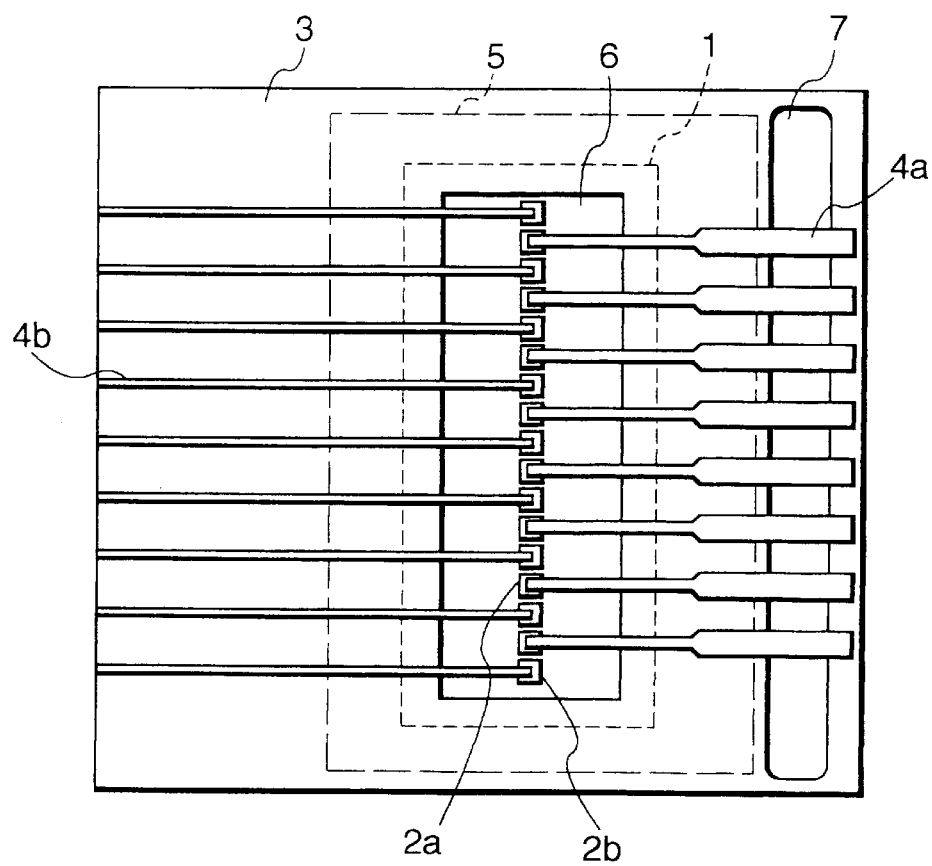
FIG. 11 is an illustration for explaining problems of a conventional semiconductor device for LCDs.
Figure 12A:
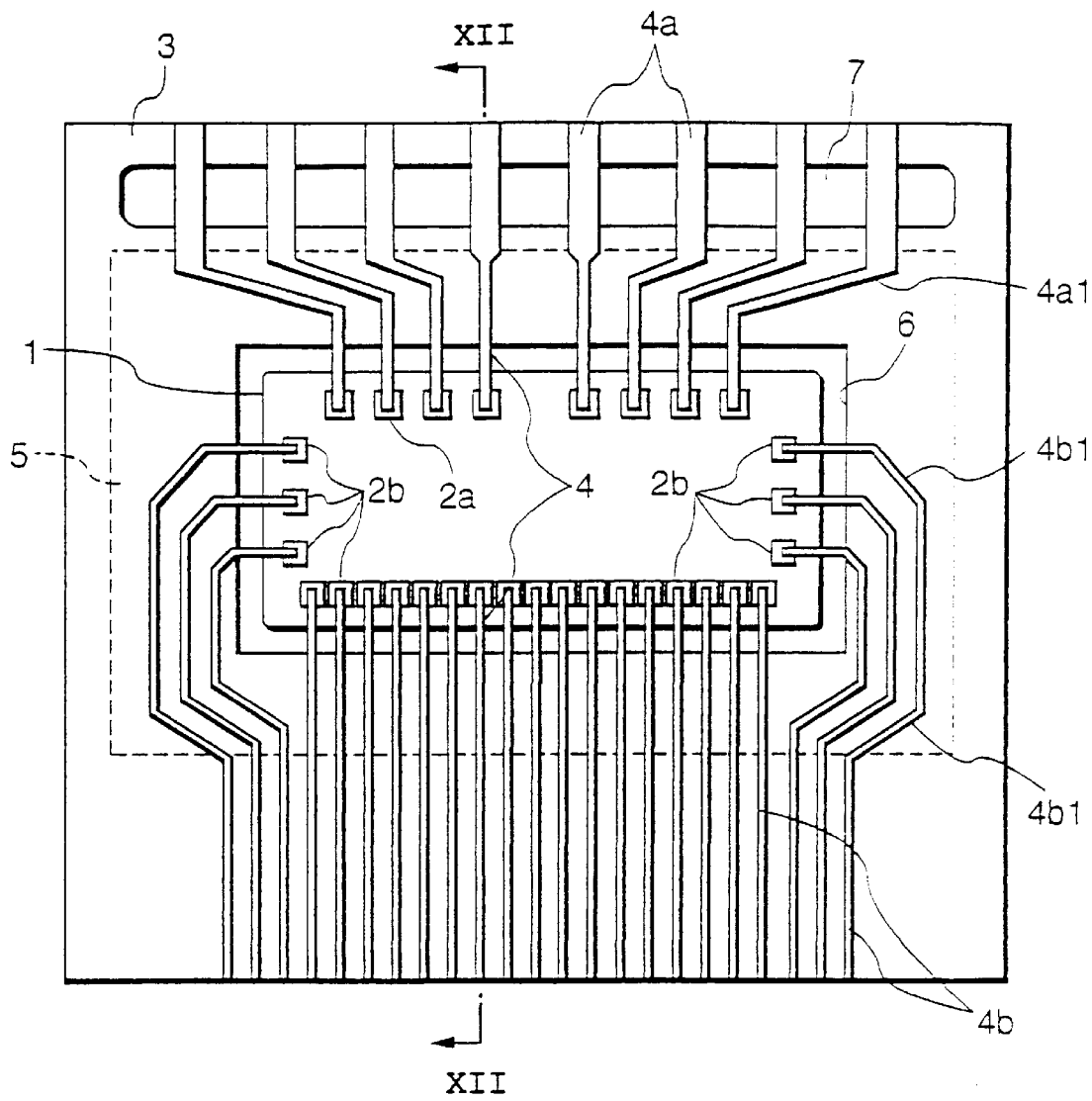
FIGS. 12(a) and 12(b) are views for describing problems with a conventional device.
Figure 12B:
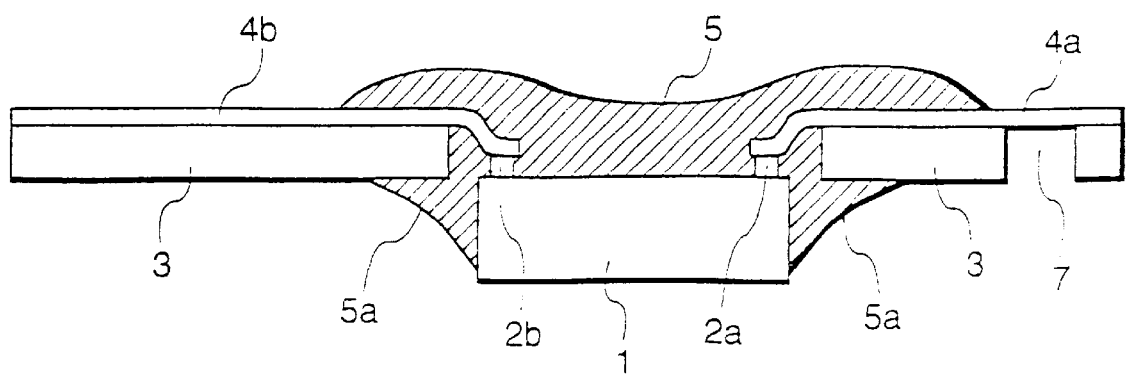

That is, by forming the test-device (TEG) and alignment-mark area 22 between the input electrode pad 2a and one end (one long side) of the semiconductor chip 1 and setting the output buffer 26 between the output electrode pad 2b and the other end (other long side) of the semiconductor chip 1, it is possible to secure an area for overlapping the thin resin film (tape) 3 with the semiconductor chip 1 between one end and the input electrode pad 2a of the semiconductor chip 1 and between the other end and the output electrode pad 2b of the semiconductor chip 1. For example, in FIG. 5, the distance from one end of the semiconductor chip 1 to the input electrode pad 2a of the chip 1 is 400 $\mu$m and the distance from the other end of the semiconductor chip 1 to the output electrode pad 2b of the chip 1 is 500 $\mu$m. The difference in the above distance is preferably minimized. Furthermore, by minimizing the internal distance between the input electrode pad 2a and the output electrode pad 2b, it is possible to further downsize a TCP in the cross direction. Furthermore, it is possible to arrange the input electrode pad 2a and the output electrode pad 2b alternately in a line on the central line of the semiconductor chip 1 in the longitudinal direction of the chip 1, as shown in FIG. 10.

Furthermore, the semiconductor chip 1 is cut in an area adjacent to the output side of the semiconductor chip 1 next to the semiconductor wafer 21 shown in FIG. 4. Thereby, it is possible to secure an area for overlapping the semiconductor chip 1 at the input side with the thin resin film 3 without deteriorating its functions or reliability of the semiconductor chip 1.

The fabrication process of the semiconductor device of embodiment 1 of the present invention is roughly divided into the wafer process, assembly process, and test process. The assembly process uses the tape carrier package assembly process disclosed on pp. 139–141 in "JISSENKOZA (transliterated) VLSI Packaging Art (Volume One)" issued by Nikkei Business Publications, Inc. on May 31, 1993.

That is, a semiconductor device is fabricated in the following process sequence.

(1) Wafer process (Including bump process)
(2) Die-sorting
(3) Grinding
(4) Dicing
(5) Inner lead-bonding
(6) Potting
(7) Marking
(8) Burn-in and test
(9) Packaging
(10) Shipping As understood from the above description, embodiment 1 of the present invention makes it possible to compactly and securely connect a circuit board with a semiconductor device when the semiconductor device is mounted on the substrate because the sealing resin 5 flows to and spreads on the back of the thin resin film (tape) 3 by forming the thin resin film (tape) 3 on the whole margin of the principal plane of the semiconductor chip 1 and making the device hole 6 smaller than the semiconductor chip 1. Thereby, it is possible to downsize the semiconductor chip 1 without deteriorating its functions or reliability.

Moreover, by separately arranging the input lead 4a and the output lead 4b in a line in parallel, it is possible to eliminate a folded portion of a lead. Therefore, it is possible to decrease the frequency of shorting between the input lead 4a and the output lead 4b. Thereby, it is possible to downsize the semiconductor chip 1 without deteriorating its functions or reliability.

Moreover, by arranging the distance up to the input electrode pad 2a of the semiconductor chip 1 and the output electrode pad 2b of the chip 1 from the other end of the chip 1 at the central portion of the chip 1 in the longitudinal direction of the chip 1, a large-enough overlapped portion can be obtained between the semiconductor chip 1 and the thin resin film (tape) 3. Therefore, it is possible to easily execute the fabrication process and securely prevent the sealing resin 5 from flowing to and spreading on the back of the thin resin film 3. Thereby, it is possible to downsize the semiconductor chip 1 without deteriorating its functions or reliability.

Furthermore, by substantially equalizing the arrangement pitch between the input electrode pad 2a and the output electrode pad 2b of the semiconductor chip 1 with that of the input lead 4a and the output lead 4b of the chip 1 and arranging the input lead 4a and the output lead 4b at equal intervals at the central portion of the chip 1 only in the longitudinal direction of the chip 1,it is possible to reduce the frequency of shorting between leads. Therefore, it is possible to downsize the semiconductor chip 1 without deteriorating its functions or reliability.

Furthermore, by forming the test-device and alignment-mark area 22 between the input electrode pad 22a and one end of the semiconductor chip 1, setting the output buffer 26 between the output electrode 2b and the other end of the semiconductor chip 1, and substantially equalizing the distance between one end and the input electrode pad 2a of the semiconductor chip with that between the other end and the output electrode pad 2b of the semiconductor chip, a large overlapped portion between the semiconductor chip 1 and the thin resin film (tape) 3 can be obtained at both input and output sides. Therefore, it is possible to execute the fabrication process more easily and securely, and to securely prevent the sealing resin 5 from flowing to and spreading on the back of the thin resin film (tape) 3. Thereby, it is possible to downsize the semiconductor chip 1 without compromising its functions or reliability.

Furthermore, because the semiconductor chip 1 is cut in an area adjacent to the output side of the next semiconductor chip 1, it is possible to downsize the semiconductor chip 1 without deteriorating its functions and reliability.

Embodiment 2

Figure 6:
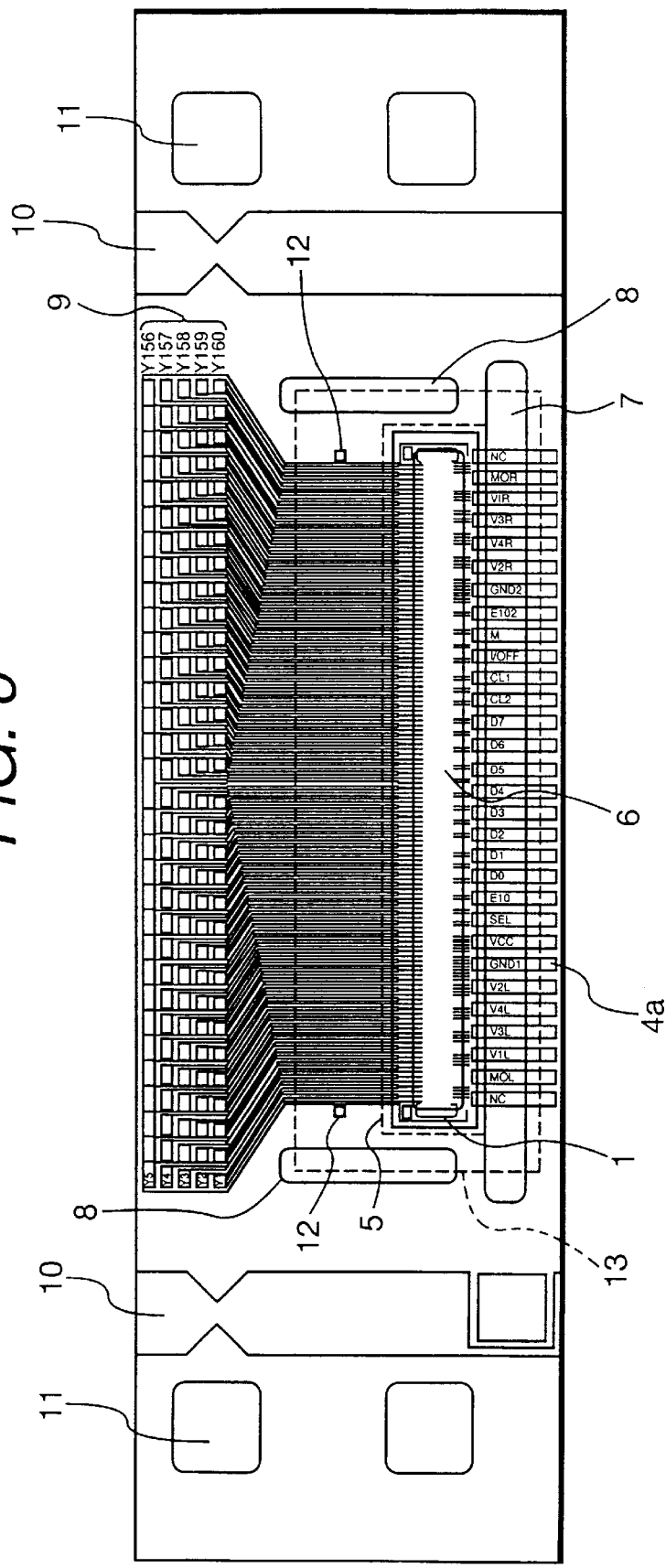
FIG. 6 is a top view showing the structure of a TCP tape for the semiconductor device for LCDs of embodiment 2 of the present invention.
Figure 7:
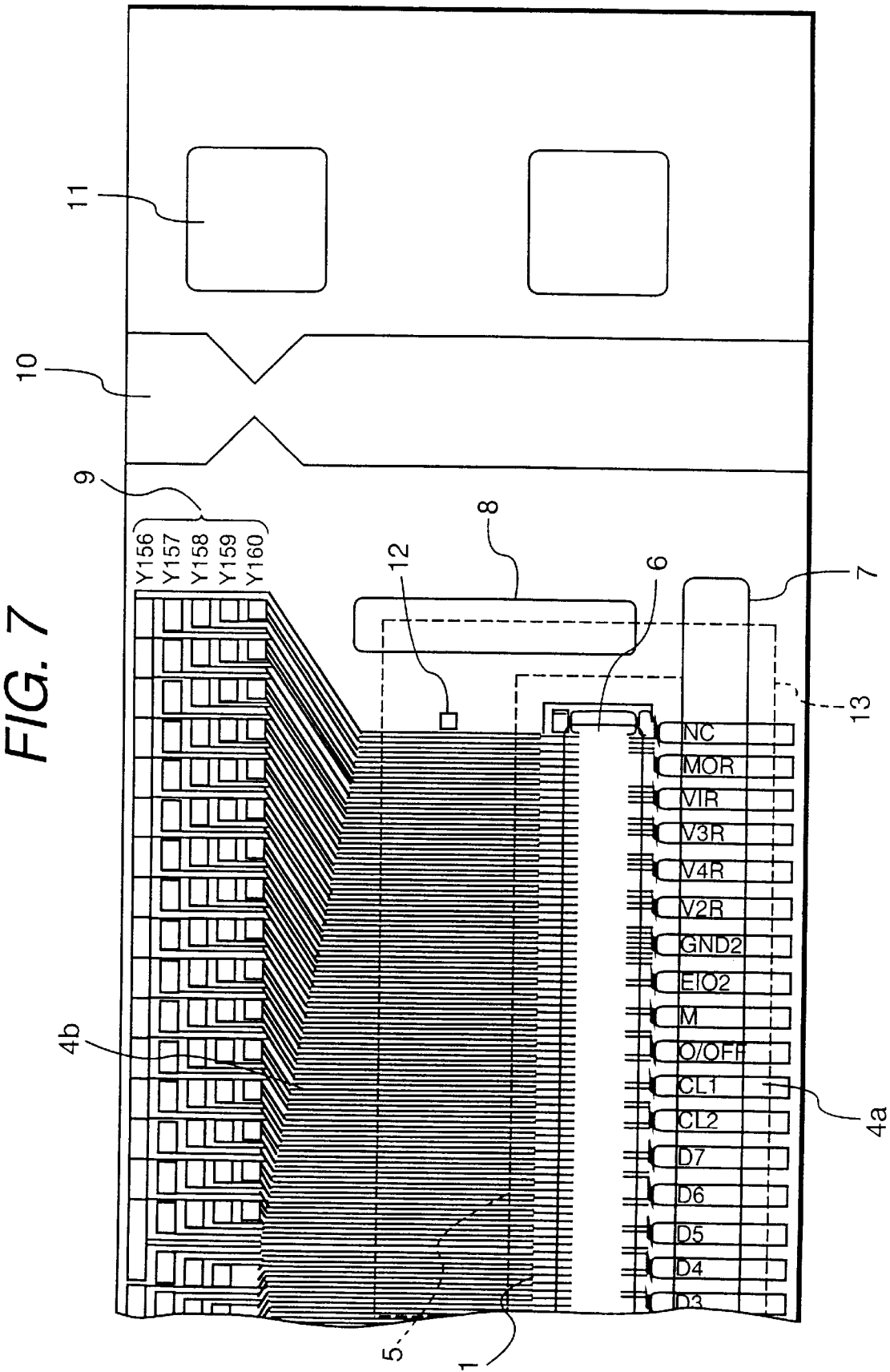
FIG. 7 is a local enlarged view of the structure in FIG. 6.

FIG. 6 is a top view showing the structure of a TCP tape of the semiconductor device for LCDs of embodiment 2 of the present invention and FIG. 7 is a locally enlarged view of FIG. 6. In FIGS. 6 and 7, reference numeral 1 represents a semiconductor chip, 2 represents an electrode pad, 4 represents inner leads of an input lead and an output lead, 4a represents an input lead, 4b represents an output lead, 5 represents a sealing resin, 6 represents a device hole for electrically connecting the semiconductor chip 1 with the inner leads 4, 7 represents an input-side hole to which a soldering iron is applied to mount a semiconductor device for LCDs on a printed circuit board, 8 represents an auxiliary slit when striking a semiconductor device with a die, 9 represents a probe applying pad, 10 represents a plated lead, 11 represents a sprocket hole for sending a semiconductor device, 12 represents an alignment mark used to bond a semiconductor device to glass with pressure, and 13 represents an area (enclosed by a dotted line) to be cut by a user, that is, a range to be mounted.

The semiconductor device for LCDs of embodiment 2 of the present invention has the same basic structure as the semiconductor device of embodiment 1 shown in FIG. 1.

The position of the semiconductor chip 1 is shown by a dotted line, which has a long-side length of 14.83 mm and a short-side length of 1.53 mm. The device hole 6 is smaller than the semiconductor chip 1. The user area of the TCP tape 3 has a long-side length of 17.6 mm and a short-side length of 5.5 mm.

The thin resin film (tape) 3 uses, for example, a polyimide tape. The input and output leads 4a and 4b are made of a copper (Cu) foil pattern. The outer lead of the input lead 4a comprises, for example, 30 leads including 28 input leads and one dummy lead at both ends respectively. The output lead 4b comprises 162 leads including 160 output leads and one dummy lead at both ends respectively.

As shown in FIG. 7, the probe applying pad 9 comprises, for example, pads Y156, Y157, Y158, Y159, and Y160. The plated lead 10 is easily electrified because a tape 3a is made of polyimide and it may cause electrostatic breakdown in the semiconductor chip 1. To protect the semiconductor chip 1 from electrostatic breakdown, a copper (Cu) foil pattern for all the semiconductor devices 3 is used to prevent local electrification.

The semiconductor device for LCDs of embodiment 2 of the present invention has the same functions and advantages as the semiconductor device of embodiment 1.

Embodiment 3

Figure 8:
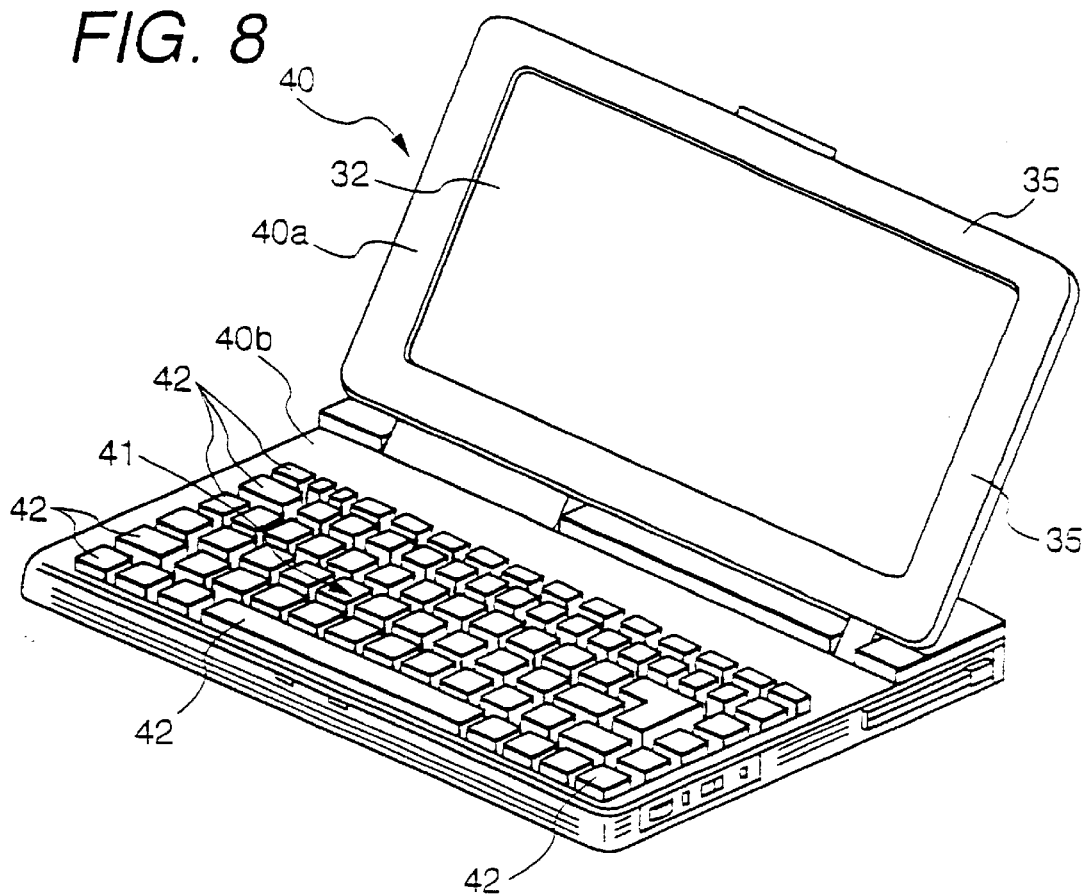
FIG. 8 is a perspective view of a notebook-size personal computer with the liquid crystal display unit of embodiment 3 of the present invention.
Figure 9:
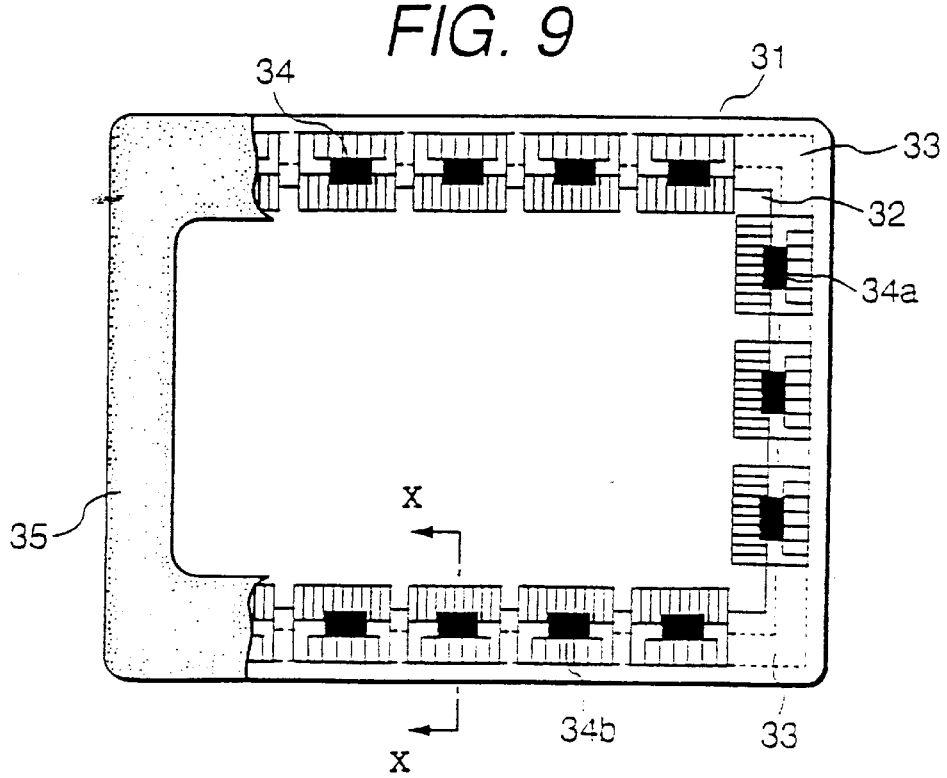
FIG. 9 is a partial top view of the liquid crystal display section of the notebook-size personal computer shown in FIG. 8.

FIG. 8 is a general perspective view of a portable computer of the present invention, FIG. 9 is a partial top view of the liquid crystal display section of a portable computer, and FIG. 10 is a sectional view of the computer in FIG. 8, taken along the line X—X of FIG. 8.

The portable computer in FIG. 8 is, for example, a notebook-size personal computer 40. The notebook-size personal computer comprises a first case 40a having a liquid crystal display section and a second case 40b having a keyboard structure (keyboard section). The first case 40a is hinged to the second case 40b so that it can open or close the second case 40b.

A liquid crystal display section 32 is secured to the inside of the first case 40a. The liquid crystal display section 32 comprises, for example, a liquid crystal display, which is driven by a common-driver semiconductor device 34a and a segment-driver semiconductor device 34b shown in FIG. 9. The common-driver semiconductor device 34a and the segment-driver semiconductor device 34b are electrically controlled by a semiconductor device (CPU) or the like provided in the second case 40b.

As shown in FIGS. 8 and 9, the periphery of the liquid crystal display section 32 is covered with a frame 35 which is a part of the first case 40a. Therefore, the common-driver semiconductor device 34a, the segment-driver semiconductor device 34b, and a printed circuit board 33 to be mentioned later cannot be seen from the outside.

Moreover, a keyboard structure (keyboard section) 41 is attached to the principal plane of the second case 40b. The keyboard structure 41 includes a plurality of keys 42 which are regularly arranged.

FIG. 9 is a partial top view of the liquid crystal display section of the portable computer, the printed circuit board 33 is arranged around the liquid crystal display section 32, and a plurality of common-driver semiconductor devices 34a and a plurality of segment-driver semiconductor devices 34b are arranged between the liquid crystal display section 32 and the printed circuit board 33. As shown in FIG. 10, output leads of the common-driver semiconductor devices 34a and those of the segment-driver semiconductor devices 34b are electrically connected with the liquid crystal display section 32 by an anisotropic conductive sheet. Moreover, input leads of the common-driver semiconductor devices 34a and those of the segment-driver semiconductor devices 34b are electrically connected with the printed circuit board 33 by solder 37.

From FIGS. 9 and 10, it is clear that the width of the frame 35 serving as a part of the first case 40a can be decreased by downsizing the common-driver semiconductor devices 34a and the segment-driver semiconductor devices 34b.

The common-driver semiconductor device 34a and the segment-driver semiconductor device 34b use the semiconductor devices of the above embodiments 1 and 2 respectively.

The liquid crystal display unit of embodiment 3 of the present invention has a long-side length of approx. 270 mm, a short-side length of approx. 180 mm, and a display area of approx. 240 mm×160 mm. The width of the long side of the frame 35 is approx. 7 to 10 mm and the width of the short side of it is approx. 10 to 15 mm.

Therefore, because the common-driver semiconductor device 34a and the segment-driver semiconductor device 34b use the semiconductor devices for LCDs of the above embodiments 1 and 2 respectively, it is possible to increase the display area while keeping the frame size of the liquid crystal display unit constant, or decreasing the frame size while keeping the display area constant.

The invention made by the present inventors is specifically described in accordance with the above embodiments. However, the present invention is not restricted to these embodiments. It is a matter of course that various modifications of the present invention can be made as long as they do not go out of the range of the gist of the present invention.

Advantages of a typical invention among the inventions disclosed in the present application are briefly described below.

(1) It is possible to downsize a semiconductor chip without deteriorating its functions or reliability because a sealing resin does not flow to or spread on the back of a TCP tape and a packaging board can compactly and securely be connected with a semiconductor device.

(2) It is possible to downsize a semiconductor chip without deteriorating its functions or reliability because any folded portion can be eliminated from leads by separately arranging input leads and output leads in a line in parallel.

(3) By arranging electrode pads or bumps of a semiconductor chip at the central portion of the semiconductor chip in the longitudinal direction of the chip, a sufficiently large overlap portion can be obtained between the semiconductor chip and a thin resin film (tape) of a TCP tape. Therefore, the fabrication process can easily be executed and a sealing resin can be prevented from flowing to or spreading on the back of the tape 3. Thus, it is possible to downsize the semiconductor chip without deteriorating its functions or reliability.

(4) By substantially equalizing the arrangement pitch between electrode pads or bumps of a semiconductor chip with that of leads of the semiconductor chip and arranging the leads at equal intervals at the central portion of the chip only in the longitudinal direction of the chip, the shorting frequency between leads is decreased. Therefore, it is possible to downsize the semiconductor chip without deteriorating its functions or reliability.

(5) By setting a test device and an alignment mark between an input electrode pad and one end of a semiconductor chip, setting an output buffer between an output electrode pad and the other end of the semiconductor chip, and substantially equalizing the distance between one end and the input electrode pad of the semiconductor chip with that between the other end and the output electrode pad of the chip, a sufficiently large overlap portion can be obtained between the semiconductor chip and a thin resin film (tape) of a TCP tape at both input and output sides. Therefore, the fabrication process can securely and easily be executed and a sealing resin can securely be prevented from flowing to or spreading on the back of the TCP tape 3. Thus, it is possible to downsize the semiconductor chip without deteriorating its functions or reliability.

(6) It is possible to downsize a semiconductor chip without deteriorating its functions or reliability because the semiconductor chip is cut in an area adjacent to the output side of the next chip.

(7) Because a downsized semiconductor device for LCDs of the present invention is used as common-driver and segment-driver semiconductor devices respectively, it is possible to increase a display area in size by keeping the frame size of a liquid crystal display unit constant or downsize the frame by keeping the size of the display area constant.

What is claimed is:

1. A display unit comprising a display panel, a printed circuit board, and a semiconductor device electrically connected with the display panel and the printed circuit board; wherein the semiconductor device has a semiconductor chip having a principal surface including first bonding pads and second bonding pads, a thin resin film having a surface and a back, and locally having an opening reaching the back from the surface, first leads formed over the surface of the thin resin film and extending across the thin resin film, the first leads having one end extending into the opening and being electrically connected to said first bonding pads, second leads formed over the surface of the thin resin film and extending across the thin resin film, the second leads having one end extending into the opening and being electrically connected to said second bonding pads, and a sealing resin for covering the principal surface of the semiconductor chip exposed through the opening and a portion of the thin resin film from which the first and second leads extend into the opening;

wherein the thin resin film overlaps the semiconductor chip between the semiconductor chip and the first and second leads; and wherein said first leads are electrically connected to said printed circuit board via solder and said second leads are electrically connected to said display panel via a conductive sheet.

2. The display unit according to claim 1, wherein the first bonding pads are used for input and the second bonding pads are used for output.

3. The display unit according to claim 2, wherein the first bonding pads are arranged in a line at a predetermined pitch the first leads are arranged at a predetermined pitch, and the pitch between the first bonding pads is equal to the pitch between the first leads.

4. The display unit according to claim 3, wherein the second bonding pads are arranged in a line at a predetermined pitch, the second leads are arranged at a predetermined pitch, and the pitch between the second bonding pads is equal to the pitch between the second leads.

5. The display unit according to claim 2, wherein an output buffer is provided between the second bonding pads and an edge of the semiconductor chip under which the second leads extend.

6. The display unit according to claim 2, wherein a test-device arrangement area is formed between the first bonding pads and an edge of the semiconductor chip under which the first leads extend.

7. The display unit according to claim 1, wherein said semiconductor chip further has a rear surface which is opposite to said principal surface, and side surfaces between said principal surface and said rear surface; and wherein said rear surface and said side surfaces are exposed.

8. The display unit according to claim 1, further comprising: a frame for sealing a part of said display panel, said printed circuit board and said semiconductor device.

9. The display unit according to claim 8, wherein a plurality of said semiconductor devices are sealed by said frame.

10. The display unit according to claim 8, wherein said frame seals the periphery of said display panel.

11. The display unit according to claim 4, further comprising a logic circuit on the principal surface of the semiconductor chip between and electrically connected to the first bonding pads and the second bonding pads.

12. A display unit comprising a rectangular-shaped display panel, a printed circuit board arranged around a periphery of the display panel, and a semiconductor device electrically connected with the display panel and said printed circuit board; wherein the semiconductor device has:

a semiconductor chip having a principal surface including first bonding pads and second bonding pads, a thin resin film having a surface and a back, and locally having an opening reaching the back from the surface, first leads formed over the surface of the thin resin film and extending across the side of the thin resin film, the first leads having one end extending into the opening and being electrically connected to said first bonding pads, second leads formed over the surface of the thin resin film and extending across the side of the thin resin film, the second leads having one end extending into the opening and being electrically connected to said second bonding pads, and a sealing resin for covering the principal surface of the semiconductor chip exposed through the opening and a portion of the thin resin film from which the first and second leads extend into the opening;

wherein the thin resin film overlaps the semiconductor chip between the semiconductor chip and the first and second leads; and wherein said first leads are electrically connected to said printed circuit board via solder and said second leads are electrically connected to said display panel via a conductive sheet.

13. The display unit according to claim 12, further comprising a frame for sealing a part of said display panel, said printed circuit board and said semiconductor device.

14. The display unit according to claim 13, wherein a plurality of said semiconductor devices are sealed by said frame.

15. The display unit according to claim 13, wherein said frame seals the periphery of said display panel.

16. The display unit according to claim 12 wherein said first bonding pads are used for input and said second bonding pads being used for output.

17. The display unit according to claim 16, wherein an output buffer is arranged between the second bonding pads and an edge of the semiconductor chip under which the second leads extend.

18. The display unit according to claim 16, wherein a test-device arrangement area is formed between the first bonding pads and an edge of the semiconductor chip under which the first leads extend.

19. The display unit according to claim 16, wherein the first bonding pads are arranged in a line at a predetermined pitch, the first leads are arranged at a predetermined pitch, and the pitch between the first bonding pads is equal to the pitch between the first leads.

20. The display unit according to claim 19, wherein the second bonding pads are arranged in a line at a predetermined pitch, the second leads are arranged at a predetermined pitch, and the pitch between the second bonding pads is equal to the pitch between the second leads.

* * * * *